(12) United States Patent
Farys et al.

(10) Patent No.: US 8,490,028 B2
(45) Date of Patent: Jul. 16, 2013

(54) METHOD FOR DETERMINING A GREY LEVEL ETCH MASK

(75) Inventors: Vincent Farys, Saint Martin D'heres (FR); Stephanie Audran, Le Touvet (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/241,011

(22) Filed: Sep. 22, 2011

(65) Prior Publication Data

US 2012/0148943 A1 Jun. 14, 2012

(30) Foreign Application Priority Data

Dec. 10, 2010 (FR) .................................... 10 60373

(51) Int. Cl.
*G06F 17/50* (2006.01)
(52) U.S. Cl.
USPC .......................................................... 716/51
(58) Field of Classification Search
USPC .................................................. 716/100, 51
See application file for complete search history.

(56) References Cited

U.S. PATENT DOCUMENTS

| 2003/0101421 | A1 | 5/2003 | Satoh |
| 2006/0240336 | A1* | 10/2006 | Watson et al. ................... 430/5 |
| 2007/0061773 | A1* | 3/2007 | Ye et al. .......................... 716/21 |
| 2007/0122718 | A1 | 5/2007 | Mizusako et al. |
| 2008/0123935 | A1* | 5/2008 | Misaka ........................ 382/144 |
| 2011/0318672 | A1* | 12/2011 | Ogadhoh et al. ................. 430/5 |

FOREIGN PATENT DOCUMENTS

EP 1589373 10/2005

* cited by examiner

*Primary Examiner* — Suchin Parihar
(74) *Attorney, Agent, or Firm* — The Noblitt Group, PLLC

(57) ABSTRACT

A method for determining, by means of a computer, a photolithography mask for the manufacturing a microstructure by grey level etching of a resist layer, this mask including a plurality of elementary cells, each including an opaque area arranged, in top view, in a non-peripheral portion of a transparent region or, conversely, in a transparent area arranged, in top view, in a non-peripheral portion of an opaque region, comprising the steps of:
  a) initializing the mask pattern in a first state;
  b) determining, by simulation, the profile of the microstructure which would result from the use of the mask according to said pattern;
  c) adjusting said pattern by modifying, in certain cells, the position of the opaque or transparent area within the cell; and
  d) forming the mask according to said pattern.

8 Claims, 3 Drawing Sheets

METHOD FOR DETERMINING A GREY LEVEL ETCH MASK

BACKGROUND OF THE INVENTION

1. Field of the Invention

The present invention relates to the forming of a photolithography mask for the manufacturing of a microstructure by grey level etching of a resist layer. It more specifically aims at a method for determining the mask pattern based on a desired microstructure profile.

The examples and embodiments discussed hereafter more specifically relate to masks intended for the manufacturing of a microlens coating the surface of exposure to light of an image sensor pixel. The present invention however more generally applies to any type of microstructure that may be formed by grey level etching of a resist layer, for example micromechanical structures.

2. Discussion of Prior Art

An image sensor is essentially formed of a pixel array formed inside and on top of a semiconductor substrate. At the surface of each pixel, a microlens is provided to concentrate the received light intensity towards a photosensitive area of the pixel.

To simultaneously form all the microlenses of a sensor, the use of a grey level resist etch method has been provided. Such a method especially comprises, in a first step, depositing a resist layer on the surface of exposure to light of the sensor. The resist is exposed through a grey level photolithography mask. The intensity of the irradiation received by the resist varies in space according to the position in the mask. In another step, the resist is developed. The sensitivity of the resist to development is proportional to the intensity of the irradiation received during the exposure. The amount of resist remaining after the development is thus inversely proportional to the grey level of the mask. One can thus, by defining an adapted mask pattern, "carve" microlenses of different shapes in the resin layer. An additional stabilizing anneal step may be provided after the development.

A benefit of such a method is that it allows a lot of flexibility as to the shape of the microlenses which may be formed. In particular, it is possible to form on a same sensor, in a single photolithography step, microlenses of different shapes. As an example, French patent application FR2945666 describes an image sensor in which each pixel, other than the central pixel (s) of the array, comprises an asymmetrical microlens topping in vertical projection the substrate portion associated with the pixel. The shape and the optical axis of each microlens are selected according to the pixel position in the array, so that the received light rays converge towards the photosensitive area of the pixel. Thus, for each pixel, the shape of the microlens is adapted to the average angle of incidence of the light rays received by the pixel, which improves the sensitivity with respect to sensors in which all microlenses are identical.

FIG. 1 is a top view schematically showing an example of a photolithography mask 1 for the grey level etching of a microlens in a resist layer.

Mask 1 is essentially formed of a transparent plate 1a, for example, made of glass or of quartz, having opaque areas 1b formed at its surface, for example, in the form of chromium pads or islands or of any other suitable opaque material.

Mask 1 comprises a plurality of elementary cells 3, each corresponding to a portion of the mask. In this example, cells 3 are, in top view, square and arranged in an array of 7 rows by 7 columns side by side. The division into elementary cells is symbolized in the drawing by a grid in dotted lines. Opaque areas 1b have, in top view, dimensions smaller than the dimensions of cells 3. Each cell 3 comprises an area 1b arranged in its central portion. In this example, each area 1b has the shape of a square having its center coinciding with the center of the corresponding cell 3.

In a given cell 3, the grey level corresponds to the ratio between the surface area taken up by opaque area 1b and the total cell surface area. The higher the grey level of the cell, the smaller the thickness of etched resin. Conversely, the lower the grey level of the cell, the greater the thickness of etched resin. By varying the size of pads 1b, the grey level of each cell can be varied, to thus define various etch levels. The pattern of the mask shown in FIG. 1 corresponds to the forming of a symmetrical microlens.

To define the mask pattern, the three-dimensional profile of the microstructure which is desired to be formed is divided into elementary areas corresponding, in top view, to cells 3. For each elementary area, the average resin height necessary to achieve the desired profile is determined. A curve of correspondence between the irradiation intensity received by the resin and the resin height remaining after development enables to define the opaque surface area 1b to be provided in each cell 3 of the mask.

In practice, for the resin exposure, mask 1 may be placed directly in contact with the resin layer, or be suspended above the resin by means of wedges, or again be used in an optical system in projection. The step of elementary cell array 3 is selected so that, taking diffraction phenomena into account, the space variations of the irradiation intensity received by the resin are progressive. This enables to form a microstructure with a curved surface, for example, a microlens, from a mask only comprising black (opaque) and white (transparent) areas.

In many cases, and in particular for microstructures with curved surfaces, it is not possible to obtain an exact matching between the ideal desired profile and the profile really printed into the resin. The accuracy with which any desired profile can effectively be obtained is linked to the resolution of elementary cell array 3 of the mask. Increasing the resolution would amount to decreasing the array step, which is generally impossible due to the above-discussed optical constraints, and due to the limited resolution of mask manufacturing tools.

FIG. 2 is a cross-section view schematically illustrating profiles 21R and 21I of a microlens coating the surface of exposure to light of an image sensor pixel 20. Profile 21R corresponds to a microlens obtained by grey level etching of a resist layer, by using mask 1 of FIG. 1 for the resist exposure. Profile 21I corresponds to the ideal target profile, that is, to the profile which would really be desired to be obtained, and which has been used as a basis for the determination of the pattern of mask 1. It can be observed that real profile 21R does not faithfully coincide with profile 21I.

It would be desirable to be able to form microstructures having any type of profile, by grey level etching of a resist layer, with a greater accuracy than with current methods.

SUMMARY OF THE INVENTION

Thus, a feature of an embodiment provides a method for determining a photolithography mask for the manufacturing of a microstructure by grey level etching of a resist layer, at least partly overcoming some of the disadvantages of current methods.

Another feature of an embodiment is to provide such a method enabling to form microstructures having any type of profile with a greater accuracy than with current methods.

Another feature of an embodiment is to provide such a method which is easy to implement.

Another feature of an embodiment is to improve the sensitivity of an image sensor.

Thus, an embodiment provides a method for determining, by means of a computer, a photolithography mask for the manufacturing of a microstructure by grey level etching of a resist layer, this mask comprising a plurality of elementary cells, each comprising an opaque area arranged, in top view, in a non-peripheral portion of a transparent region or, conversely, in a transparent area arranged, in top view, in a non-peripheral portion of an opaque region, comprising the steps of:

a) initializing the pattern of the mask in a first state;

b) determining, by simulation, the profile of the microstructure which would result from the use of the mask according to said pattern;

c) adjusting said pattern by modifying, in certain cells, the position of the opaque or transparent area within the cell; and d) forming the mask according to said pattern.

According to an embodiment, this method further comprises, between step b) and step c), a step of determination, for each cell, of the average error gradient between said simulated profile and a profile of the desired microstructure, in the profile portion corresponding to the cell.

According to an embodiment, at step c), in each cell for which the average gradient exceeds a threshold, the opaque or transparent area is displaced in a direction opposite to said average gradient.

According to an embodiment, the amplitude of the displacement is proportional to the norm of said average gradient.

According to an embodiment, at step a), the initialization state of the pattern is determined from the profile of the desired microstructure, according to the following steps:

for each cell, determining the average resist height remaining in the portion of the resist layer to achieve the desired profile;

deducing therefrom, by using a curve of correspondence between the intensity of irradiation received by the resist and the resist height remaining after development, the dimensions of the opaque or transparent area which must be provided in the cell; and positioning the opaque or transparent area so that its center coincides with the center of the cell.

According to an embodiment, the curve of correspondence is determined in a previous calibration phase comprising a step of exposure of a resist layer through a reference mask, a resist development step, and a step of measurement of the resist height remaining after development.

According to an embodiment, step b) comprises the steps of:

determining, by simulation, from said pattern, the distribution of the intensity of irradiation which would be received by the exposed resist layer through a mask according to said pattern;

deducing therefrom, by means of said correspondence curve, the profile of the microstructure which would result from the use of a mask according to said pattern.

An embodiment provides a method for manufacturing a microstructure by grey level etching of a resist layer, comprising the steps of:

determining a photolithography mask as indicated hereabove; and exposing the resist layer through said mask.

The foregoing and other features, and benefits will be discussed in detail in the following non-limiting description of specific embodiments in connection with the accompanying drawings.

DETAILED DESCRIPTION

Figure 1:
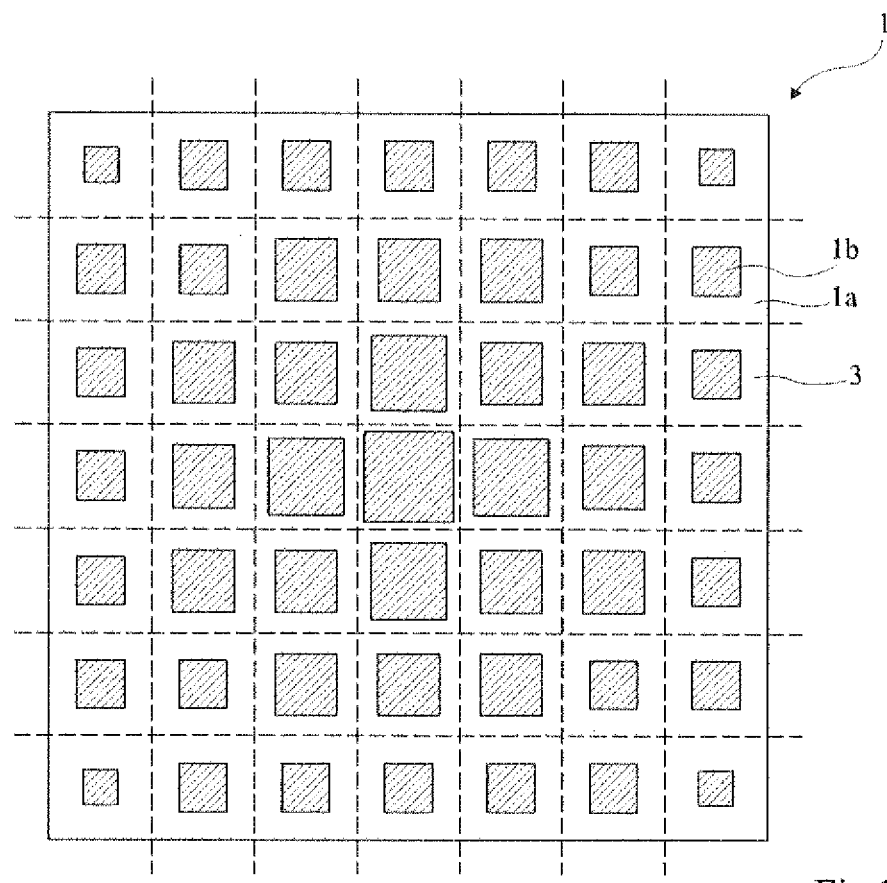
FIG. 1, previously described, is a top view schematically showing an example of a photolithography mask for the grey level etching of a microlens in a resist layer.
Figure 2:
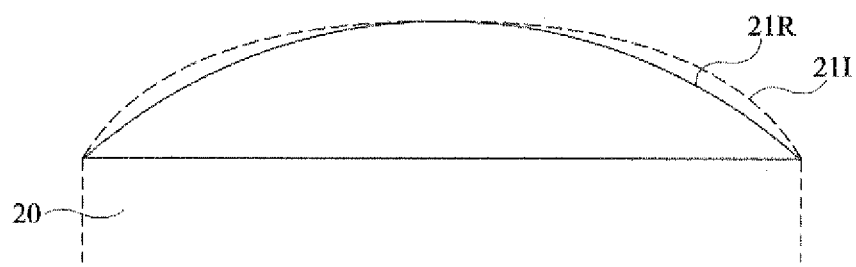
FIG. 2 is a cross-section view schematically illustrating profiles of a microlens coating the surface of exposure to light of an image sensor pixel.

For clarity, the same elements have been designated with the same reference numerals in the different drawings and, further, the various drawings are not to scale.

To improve the accuracy with which a desired microstructure profile can be printed in a resist layer by means of a photolithography mask of the type described in relation with FIG. 1, it is here provided to introduce an additional mask pattern setting parameter, that is, the setting of the position of opaque areas 1b within elementary cells 3. The present inventors have observed that, without having to modify the dimensions of opaque area 1b, the provision of such an offset between the center of area 1b and the center of cell 3 enables to substantially adjust the shape of the obtained profile.

Figure 3:
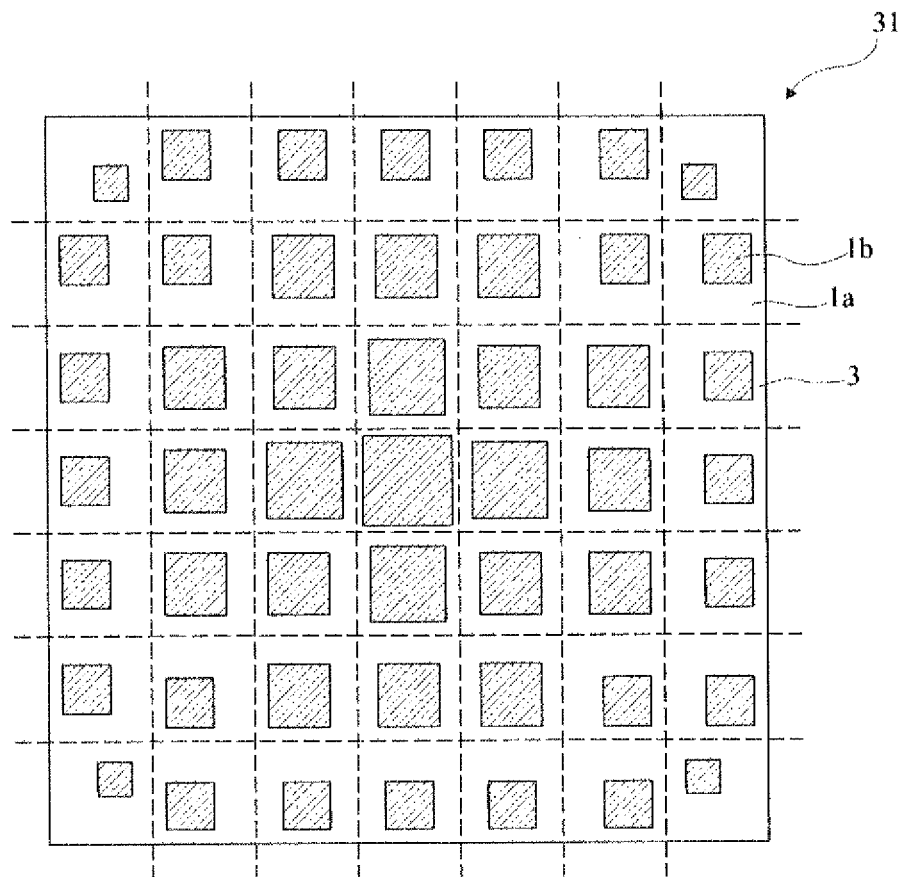
FIG. 3 is a top view schematically showing an embodiment of a photolithography mask for the grey level etching of a microlens in a resist layer.

FIG. 3 is a top view schematically showing an embodiment of a photolithography mask 31 for the manufacturing of a microlens. Mask 31 is of the same type as the mask described in relation with FIG. 1, but differs from it by the fact that in certain elementary cells 3, the center of opaque areas 1b does not coincide with the cell center. In this example, opaque areas 1b of cells 3 of the peripheral rows and columns of the array have been offset with respect to the mask of FIG. 1. However, the dimensions of areas 1b remain unchanged.

Figure 4:
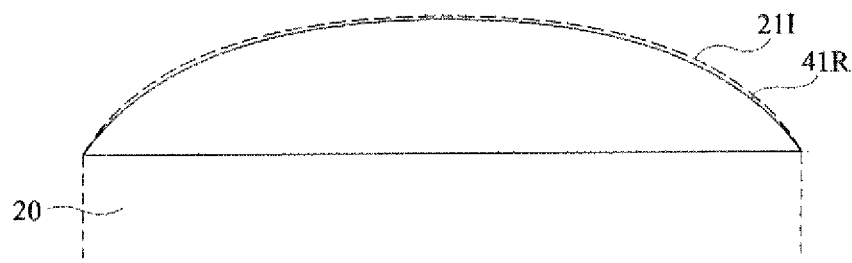
FIG. 4 is a cross-section view schematically illustrating profiles of a microlens coating the surface of exposure to light of an image sensor pixel.

FIG. 4 is a cross-section view schematically illustrating profiles 41R and 21I of a microlens coating the surface of exposure to light of an image sensor pixel 20. Profile 41R corresponds to a real microlens, obtained by grey level etching, by using mask 31 of FIG. 3 for the exposure of the resist. Profile 21I corresponds to the ideal target profile, that is, to the profile of the microlens which was really be desired to be obtained, and which has been used as a basis for the determination of the pattern of mask 31.

It can be observed that profiles 41R and 21I coincide rather accurately. As an example, the present inventors have carried out manufacturing tests for microlenses having a width of approximately 1.4 μm and a thickness of approximately 1 μm. The mask corresponding to a microlens comprises an array of 7×7 elementary square cells having a side of 200-nm length. The setting of the position of the opaque areas in certain elementary cells has provided an accuracy better than 0.1 μm in thickness between the microlens really obtained and the desired ideal profile.

Figure 5:
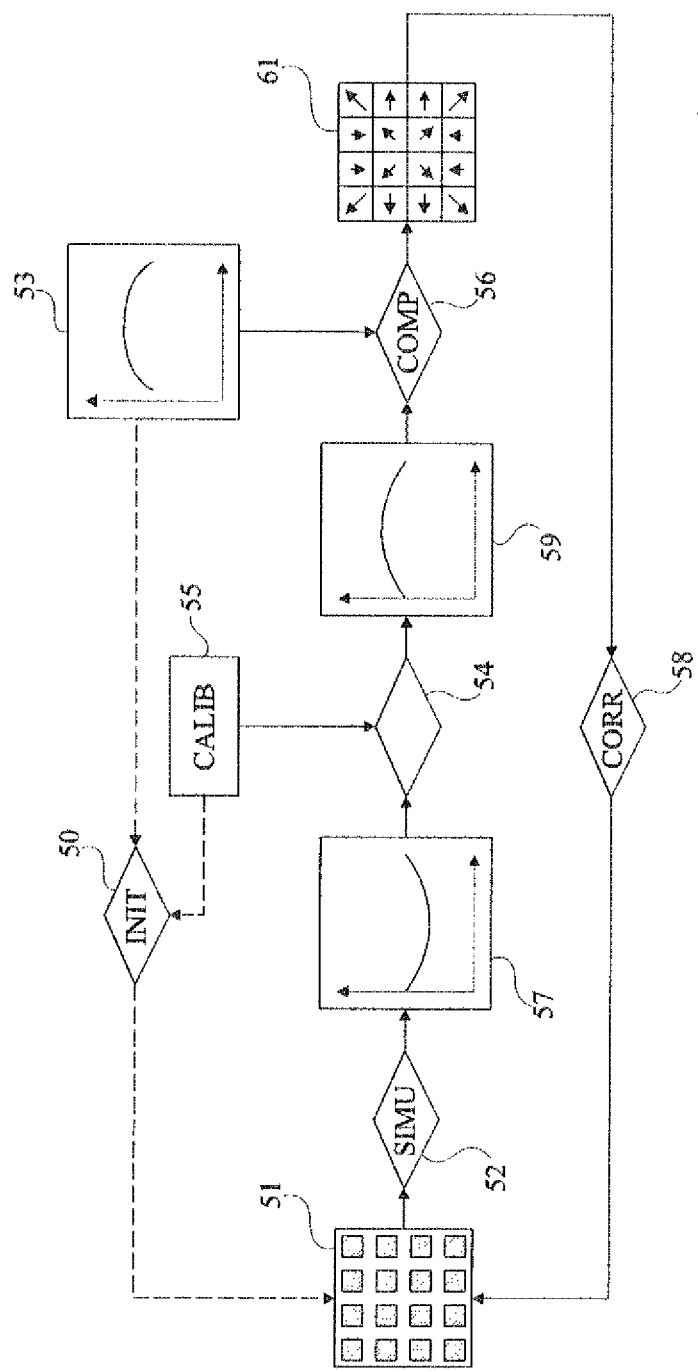
FIG. 5 is a diagram illustrating steps of an embodiment of a method for determining a photolithography mask for the manufacturing of a microstructure, based on a desired microstructure profile.

FIG. 5 schematically illustrates steps of an embodiment of a method for determining a photolithography mask, this method comprising a step of adjustment of the position of the opaque areas in certain elementary cells of the mask.

In an initial step 50 (INIT), a mask pattern 51 is roughly determined based on a desired profile 53. The initialization pattern may be obtained by a method of the above-described type, comprising determining, for each elementary cell of the mask, an average resin height to be formed in the corresponding portion of the resin layer and deducing therefrom the opaque surface area to be provided in the cell. To achieve this, a curve of correspondence 55 (CALIB) between the irradiation intensity received by the resin and the resin height remaining after development is used. Each opaque area is positioned at the center of the corresponding elementary cell, as in the example described in relation with FIG. 1.

To obtain correspondence curve 55, a calibration in the real microstructure manufacturing conditions is preferably performed. A resin layer is exposed through one or several reference masks, and then developed, and the resin height remaining after development is measured to generate curve 55. Such a calibration guarantees a better accuracy in the determination of the mask pattern. If any of the parameters of the manufacturing method changes (resin thickness, exposure dose, development solution, etc.), it is desirable to repeat the calibration step to update curve 55.

In a simulation step 52 (SIMU), a three-dimensional curve 57 of the irradiation intensity received by the resin according to the position on the mask is calculated. To achieve this, there exist various simulation tools for accurately determining, for a given mask pattern, the transfer function formed by the mask for the irradiation energy. Step 52 for example comprises calculating a double Fourier transform of the binary transfer function (opaque or transparent) corresponding to the mask, and filtering certain high spatial frequencies of this transfer function. This step will not be detailed any further herein.

In a step 54, a simulated profile 59 is calculated from intensity curve 57 and correspondence curve 55.

In a step 56 (COMP), simulated profile 59 is compared with desired profile 53.

In a correction step 58 (CORR), according to result 61 of the comparison, pattern 51 of the mask is adjusted, especially by modifying, in certain cells 3 of the mask (see FIG. 3), the position of opaque area 1b with respect to the center of the cell.

Successive steps 52, 54, 56, and 58 may be repeated several times, to obtain a satisfactory correspondence between profile 59 and desired profile 53.

According to an embodiment, in comparison step 56, for each elementary cell of the mask, the average height of simulated profile 59 is determined in the profile portion corresponding to the cell. This height is compared with the corresponding average height of desired profile 53. An average error of the height of profile 59 is thus obtained for each elementary cell of the mask. Based on the average error array, an average error gradient substantially corresponding to the average slope of the error in the profile portion corresponding to the cell is determined for each elementary cell.

In correction step 58, for each opaque area 1b, the offset to be applied is determined according to the average error gradient associated with the corresponding cell 3. As an example, in all cells 3 for which the average error gradient is greater than a threshold value, the position of opaque area 1b is modified. The offset is for example applied along a direction opposite to the gradient direction, the offset value being a function of the norm of the gradient, for example, proportional to the norm of the gradient. It will however be ascertained that opaque area 1b remains contained within cell 3.

The above-described calculation and/or simulation steps are preferably carried out by means of calculation means comprising a processor, for example, a computer.

A benefit of the provided method is that it enables to easily design masks for manufacturing microstructures having any profile type, with great accuracy.

As an example, it is provided to use such a method to improve the sensitivity of an image sensor. Generally, the pixels of an image sensor are arranged not only in a main array of rows and of columns, but also, within the array, in elementary groups of pixels, for example, in groups of four pixels of different colors forming an elementary structure of a Bayer pattern. In certain cases, the pixels of a same elementary structure share access transistors. To decrease the bulk, the transistors are placed in a central portion (in top view) of the structure. The photosensitive area of each pixel is then not exactly placed in the central portion of the pixel, but slightly offset towards the periphery of the elementary structure.

It is here provided to adjust the shape and the optical axis of the microlenses to take this offset into account. In particular, it is provided to form a sensor provided with asymmetrical microlenses, the optical axis of each microlens being calculated not only according to the pixel position on the array, but also according to the pixel position in the elementary structure to which it belongs, so that the light rays received by the pixel reach the photosensitive area substantially at its center.

Further, in an image sensor, the average photon absorption depth in the photosensitive area depends on the color of light. It is here provided to adapt the shape and the thickness of each microlens according to the color of the filter associated with the pixel.

The mask determination method described in relation with FIGS. 3 to 5 enables to form a mask to very accurately manufacture the microlenses with the desired shape.

Specific embodiments of the present invention have been described. Various alterations, modifications and improvements will readily occur to those skilled in the art.

In particular, only examples of photolithography masks comprising a plurality of elementary cells, each comprising an opaque area arranged, in top view, in a non-peripheral portion of a transparent region having its contour coinciding with the external contour of the cell have been described. It will be within the abilities of those skilled in the art to adapt the provided method to masks in which the elementary cells each conversely comprise a transparent area arranged, in top view, in a non-peripheral portion of an opaque region having its external contour coinciding with the external contour of the cell. It will also be within the abilities of those skilled in the art to adapt the provided method to compound masks, comprising both cells of a first type and inverse cells.

Further, a method comprising a step of adjusting the mask pattern by modifying, in certain elementary cells of the mask, the position of the opaque area or of the transparent area in the case of inverted cells) has been described herein. A complementary adjustment step comprising modifying the dimensions of said opaque or transparent area if the average profile height error exceeds a given threshold may also be provided.

All examples have been given in the case of the use of a positive resist. It will be within the abilities of those skilled in the art to make the necessary adaptations in case a negative resist is used.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for determining, by means of a computer a photolithography mask for the manufacture of a microstructure by grey level etching of a resist layer, the mask comprising a plurality of elementary cells each comprising an opaque area arranged, in top view, in a non-peripheral portion of a transparent region or, conversely, in a transparent area arranged, in top view, in a non-peripheral portion of an opaque region, comprising the steps of:
   a) initializing the pattern of the mask in a first state;
   b) determining, by simulation, the profile of the microstructure which would result from the use of the mask according to the pattern;
   c) adjusting the pattern by modifying, in certain cells, the position of the opaque or transparent area within the cell; and
   d) forming the mask according to the pattern; and
   further comprising, between step b) and step c), a step of determination, for each cell, of the average error gradient between the simulated profile and a profile of the desired microstructure, in the profile portion corresponding to the cell.

2. The method of claim 1, wherein, at step c), in each cell for which the average gradient exceeds a threshold, the opaque or transparent area is displaced in a direction opposite to said the average gradient.

3. The method of claim 2, wherein the amplitude of the displacement is proportional to the norm of the average gradient.

4. A method for determining, by means of a computer a photolithography mask for the manufacture of a microstructure by grey level etching of a resist layer, the mask comprising a plurality of elementary cells each comprising an opaque area arranged, in top view, in a non-peripheral portion of a transparent region or, conversely, in a transparent area arranged, in top view, in a non-peripheral portion of an opaque region, comprising the steps of:
   a) initializing the pattern of the mask in a first state;
   b) determining, by simulation, the profile of the microstructure which would result from the use of the mask according to the pattern;
   c) adjusting the pattern by modifying, in certain cells, the position of the opaque or transparent area within the cell; and
   d) forming the mask according to the pattern; and
   wherein, at step a), the initialization state of the pattern is determined from the profile of the desired microstructure, according to the following steps:
      for each cell, determining the average resist height remaining in the portion of the resist layer to achieve the desired profile;
      deducing therefrom, by using a curve of correspondence between the intensity of irradiation received by the resist and the resist height remaining after development, the dimensions of the opaque or transparent area which must be provided in the cell; and
      positioning the opaque or transparent area so that its center coincides with the center of the cell.

5. The method of claim 4, wherein the curve of correspondence is determined in a previous calibration phase comprising a step of exposure of a resist layer through a reference mask, a resist development step, and a step of measurement of the resist height remaining after development.

6. The method of claim 5, wherein step b) comprises the operations of:
   determining, by simulation, from the pattern, the distribution of the intensity of irradiation which would be received by the exposed resist layer through a mask according to the pattern; and
   deducing therefrom, by means of the correspondence curve, the profile of the microstructure which would result from the use of a mask according to the pattern.

7. A method for determining, by means of a computer, a photolithography mask for the manufacture of a microstructure by grey level etching of a resist layer, the mask comprising a plurality of elementary cells each comprising an opaque area arranged, in top view, in a non-peripheral portion of a transparent region or, conversely, in a transparent area arranged, in top view, in a non-peripheral portion of an opaque region, and manufacturing the microstructure by grey level etching of the resist layer, comprising the steps of:
   a) initializing the pattern of the mask in a first state;
   b) determining, by simulation, the profile of the microstructure which would result from the use of the mask according to the pattern;
   c) adjusting the pattern by modifying, in certain cells, the position of the opaque or transparent area within the cell;
   d) forming the mask according to the pattern; and
   exposing the resist layer through the mask.

8. The method of claim 7, wherein the microstructure is a microlens coating the surface of exposure to light of an image sensor pixel.

* * * * *